US010489541B1

(12) United States Patent
Patra et al.

(10) Patent No.: US 10,489,541 B1
(45) Date of Patent: Nov. 26, 2019

(54) HARDWARE DESCRIPTION LANGUAGE SPECIFICATION TRANSLATOR

(71) Applicant: Xilinx, Inc., San Jose, CA (US)

(72) Inventors: Anindita Patra, San Jose, CA (US); Nabeel Shirazi, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 84 days.

(21) Appl. No.: 15/820,224

(22) Filed: Nov. 21, 2017

(51) Int. Cl.
 *G06F 17/50* (2006.01)
(52) U.S. Cl.
 CPC ................... *G06F 17/5045* (2013.01)
(58) Field of Classification Search
 CPC ............... G06F 17/5045; G06F 17/505; G06F 17/5054; G06F 17/5081; G06F 2217/02; G06F 2217/06; G06F 2217/66; G06F 2217/74
 See application file for complete search history.

(56) References Cited

U.S. PATENT DOCUMENTS

| | | | | |
|---|---|---|---|---|
| 5,812,417 A * | 9/1998 | Young | .................. | G06F 17/5045 716/104 |
| 5,841,663 A * | 11/1998 | Sharma | ................ | G06F 17/5045 716/104 |
| 5,937,190 A * | 8/1999 | Gregory | .............. | G06F 17/5022 717/131 |
| 6,289,489 B1 * | 9/2001 | Bold | ................... | G06F 17/5045 716/102 |
| 6,324,680 B1 * | 11/2001 | Barnfield | ............ | G06F 17/5045 703/16 |
| 6,366,874 B1 * | 4/2002 | Lee | ...................... | G06F 17/5045 703/14 |
| 6,415,420 B1 * | 7/2002 | Cheng | ................. | G06F 17/5045 716/103 |
| 7,519,939 B2 * | 4/2009 | Tsuchiya | ............. | G06F 17/5045 716/107 |
| 7,685,555 B1 * | 3/2010 | Bertrand | ............... | G06F 17/505 716/102 |
| 8,156,459 B1 * | 4/2012 | Ou | .......................... | G06F 8/10 703/14 |
| 8,176,449 B1 * | 5/2012 | Petithomme | ........ | G06F 17/5054 716/103 |
| 8,327,311 B1 * | 12/2012 | Neema | ................. | G06F 17/5022 716/100 |
| 8,595,684 B1 | 11/2013 | Seng | | |
| 8,635,567 B1 | 1/2014 | Seng et al. | | |
| 8,661,383 B1 * | 2/2014 | Dobkin | ............... | G06F 17/5081 716/102 |
| 8,769,449 B1 | 7/2014 | Donlin et al. | | |
| 9,183,339 B1 | 11/2015 | Shirazi et al. | | |
| 9,454,630 B1 * | 9/2016 | Lee | ..................... | G06F 17/5068 |

(Continued)

*Primary Examiner* — Nha T Nguyen
(74) *Attorney, Agent, or Firm* — LeRoy D. Maunu

(57) ABSTRACT

Disclosed approaches for translating a hardware description language (HDL) specification include inputting an HDL specification of a circuit design, generating a design graph of the circuit design from the HDL specification, and determining matches between modules of the HDL specification and blocks in a library. The design graph is translated into a data model that describes matching blocks, interfaces from the library, and connections between the blocks based on the matches determined between modules of the HDL specification and blocks of the library. The data model is compatible with a graphical design environment.

20 Claims, 5 Drawing Sheets

(56) References Cited

U.S. PATENT DOCUMENTS

| | | | | |
|---|---|---|---|---|
| 10,089,426 B2* | 10/2018 | Isshiki | .................. | G06F 17/505 |
| 10,120,968 B1* | 11/2018 | Kaiser | .................. | G06F 17/5045 |
| 2004/0088685 A1* | 5/2004 | Poznanovic | ............ | G06F 8/447 |
| | | | | 717/140 |
| 2005/0091025 A1* | 4/2005 | Wilson | .................. | G06F 17/504 |
| | | | | 703/16 |
| 2005/0097493 A1* | 5/2005 | Monthie | ............. | G06F 17/5045 |
| | | | | 716/103 |
| 2005/0278684 A1* | 12/2005 | Hamilton | .................. | G06F 8/10 |
| | | | | 716/102 |
| 2007/0277151 A1* | 11/2007 | Brunel | ...................... | G06F 8/10 |
| | | | | 717/113 |
| 2008/0005705 A1* | 1/2008 | Furukawa | ............ | G06F 17/5045 |
| | | | | 716/103 |
| 2009/0158257 A1* | 6/2009 | Xu | ......................... | G06F 11/362 |
| | | | | 717/129 |
| 2010/0281443 A1* | 11/2010 | Lo | ...................... | G06F 17/5045 |
| | | | | 716/136 |
| 2011/0119655 A1* | 5/2011 | Matsuda | ............... | G06F 17/504 |
| | | | | 717/126 |
| 2012/0030646 A1* | 2/2012 | Ravindran | ................ | G06F 8/34 |
| | | | | 717/105 |
| 2013/0111423 A1* | 5/2013 | Xia | ........................... | G06F 8/43 |
| | | | | 716/103 |

* cited by examiner

HARDWARE DESCRIPTION LANGUAGE SPECIFICATION TRANSLATOR

TECHNICAL FIELD

The disclosure generally relates to conversion of a circuit design from a hardware description language specification to a specification compatible with a graphical design environment.

BACKGROUND

Circuit designs can be created in various ways. For example, circuits may be designed using a hardware description language (HDL) specification or a graphical design environment. Designing circuits using a graphical design environment may be beneficial because Intellectual Property (IP) blocks may be used where an IP block represents previously designed modules and/or interfaces of an HDL specification.

In developing a circuit design using an HDL, a circuit designer relies on HDL expertise and a library of previously developed HDL modules, which are sometimes referred to as intellectual property (IP) blocks to be identified and configured in the circuit design. The circuit designer may also identify and configure various bus-interface protocols for use in the implemented circuit. For example, tens of thousands of lines of HDL code may be written for a circuit design. As the electronic system matures, maintenance and enhancements of the RTL design may prove difficult because the corresponding HDL code will be of large volume. Manually examining such a large codebase to understand the RTL design, and then fixing any errors or adding new functionality by writing new HDL code is error prone and unwieldy. Also such a design environment precludes the use of any smart software agent that may automate aspects of the circuit design process.

SUMMARY

A disclosed method includes a programmed processor inputting an HDL specification of a circuit design and generating a design graph of the circuit design from the HDL specification. The processor determines matches between interfaces and modules of the HDL specification and interfaces and blocks in a library. The design graph is translated into a data model that describes matching blocks, interfaces from the library, and connections between the blocks based on the matches determined between modules of the HDL specification and blocks of the library. The resulting data model is compatible with a graphical design environment.

A disclosed system includes a processor and a memory and storage arrangement coupled to the processor. The memory and storage arrangement is configured with instructions that when executed by the processor cause the processor to perform operations including inputting an HDL specification of a circuit design and generating a design graph of the circuit design from the HDL specification. Matches are determined between interfaces and modules of the HDL specification and interfaces and blocks in a library. The design graph is translated into a data model that describes matching blocks, interfaces from the library, and connections between the blocks based on the matches determined between modules of the HDL specification and blocks of the library. The resulting data model is compatible with a graphical design environment.

Other features will be recognized from consideration of the Detailed Description and Claims, which follow.

BRIEF DESCRIPTION OF THE DRAWINGS

Various aspects and features of the methods and systems will become apparent upon review of the following detailed description and upon reference to the drawings in which.

DETAILED DESCRIPTION

Figure 1:
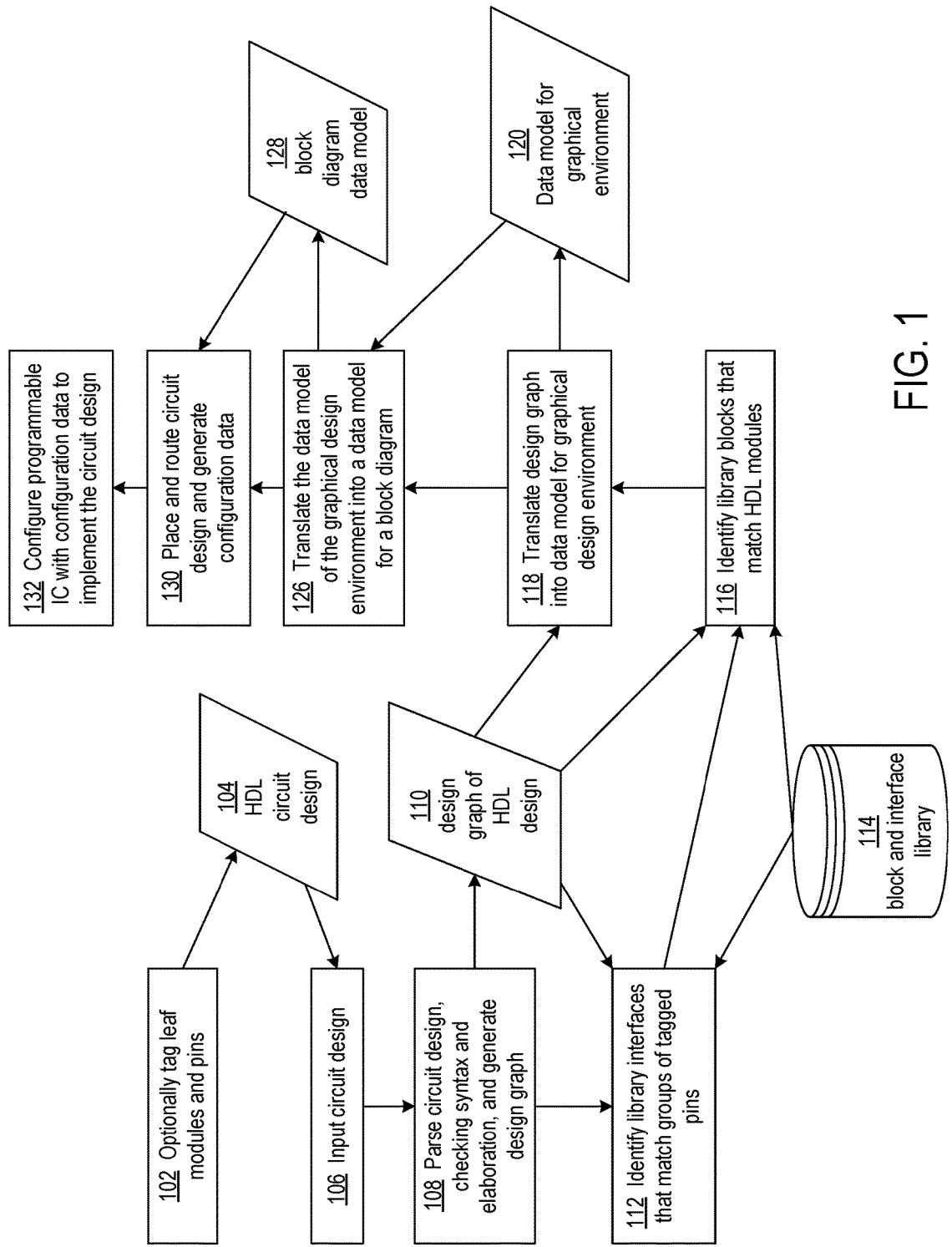
FIG. 1 shows a flowchart of an exemplary process for generating a data model based on a hardware description language (HDL) specification of a circuit design.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

HDL modules and/or interfaces may be used in many multiple circuit designs. Maintaining and updating these designs, so that recent and up-to-date versions of the HDL modules are used in circuit designs, requires writing thousands of lines of HDL code. Once updated, the circuit designs need to be verified. In some previous approaches, an entire HDL specification was manually converted to a block diagram. Such a manual conversion may include packaging HDL modules, identifying existing HDL modules in a library, mapping library modules to HDL modules of the design, identifying and packaging pins of HDL modules into corresponding bus-interfaces for the target device, building the entire circuit design in a graphical design environment by instantiating the HDL modules, configuring the HDL modules, and connecting the modules. The manual conversion can be prone to error and time consuming.

The disclosed approaches provide automated methods and systems for translating a circuit design specified in an HDL into a circuit design compatible with a graphical design environment in which the circuit design is presented as block diagram to the user. Such a translation can reduce, if not eliminate, the amount of HDL code that is written. After the HDL specification is translated to the block diagram, the circuit design can be modified and/or updated in a graphical design environment.

A translation process generally entails generating a design graph of the circuit design from the HDL specification and determining matches between modules of the HDL specification and blocks in a library of graphical design objects. The design graph can be translated into a data model compatible with a graphical design environment. An intermediate design graph can be generated based on the connections specified in the design graph and the blocks determined to match the HDL modules.

FIG. 1 shows a flowchart of an exemplary process for generating a data model based on a hardware description language (HDL) specification of a circuit design. At block 106, HDL circuit design 104 can be loaded. Prior to loading HDL circuit design 104, at block 102 leaf-level modules and/or pins in HDL circuit design 104 can be tagged. Tagging leaf-level modules can identify leaf-modules in HDL circuit design 104. Similarly, tagging pins can identify pins that are to be packaged together within an interface supported by an FPGA. Tagging can be beneficial in cases where there are no known heuristics to identify leaf-level modules and/or pins that can be packaged into an interface. As an example, if a leaf-level module is unknown such that it cannot be matched to an IP block, then the leaf-level module should be tagged. Tagging of modules and/or pins can be performed manually or automatically.

At block 108, HDL circuit design 104 can be parsed. Parsing HDL circuit design 104 can include performing a syntax and/or semantics (elaboration) check on HDL circuit design 104. In response to an error found by the syntax and/or semantics check, a prompt to correct the error can be generated. Parsing HDL circuit design 104 can result in the generation of design graph 110 of HDL circuit design 104. In design graph 110, a vertex can, for example, correspond to a HDL module, a top-level port, or a top-level interface-port. A vertex can have at least one of the following properties: name, attributes (e.g., modeling parameters and/or generics of the HDL module), boundary (e.g., pins and/or interfaces of the HDL module), and user-specified tags (e.g., modeling vendor-library-name-version (VLNV)) or a unique identifier associated with a block from a library). Vertices in the design graph are connected by edges, and an edge of design graph can, for example, correspond to a connection between two HDL modules, an HDL module and a top-level port, or an HDL module and a top-level interface or port. An edge can be defined by a source vertex and a destination vertex. A source vertex and/or a destination vertex can be a top-level pin or interface, or a pin or interface of an HDL module At block 112, the system determines matches between interfaces of block and interface library 114 and groups of tagged pins. One approach to matching examines a prefix associated with a group of pins. For example, a group of pins can be tagged with a prefix of names, "Prefix1_<logical-name>" where Prefix1 is common amongst the group of pins and <logical-name> identifies each pin in the group. If "Prefix1_<logical-name>" matches a logical pin name of an interface in block and interface library 114, then pins associated with Prefix1 can be bundled together to infer an interface named "Prefix1" and a matching protocol. As an example, a group of pins can be named, myintf_en, myintf_dout, myintf_din, myintf_we, myintf_addr, myintf_clk, and myintf_rst. Block and interface library 114 can include an interface abstraction definition type "bram_intf" that includes logical names en, dout, din, we, addr, clk, and rst, which match the logical names of "myintf." As a result, the group of pins are packaged together into an interface named "myintf" of type "bram_intf."

Individual pins can be tagged with a prefix of names for matching to elements in the block and interface library 114. For example, an individual pin can be tagged with (*X_INTERFACE_INFO="<Interface-VLNV> <Parent-Interface>    <Logical-pin    Name>"*) (*X_INTERFACE_PARAMETER="paramkey1=val1, key2=val2,key3=val3, . . . " *). Interface-VLNV can be a unique identifier of an interface-type present in block and interface library 114. Parent-Interface can be a parent interface name within which the pin should be packaged (e.g., "myintf" from above). Logical-pin name can be a logical pin name from the interface abstraction definition to which the pin should be mapped. Although not required, X_INTERFACE_PARAMETER can specify parameter key-value pairs for the parent-interface on a pin. If key-value pairs are specified on multiple pins, which have been specified to be packaged into a single package, then the first instance of X_INTERFACE_PARAMETER encountered is honored and other instances are ignored.

At block 116, matches between HDL modules of design graph 110 and blocks of block and interface library 114 can be determined. Determining matches between blocks of block and interface library 114 and HDL modules of design graph 110 is described further in association with FIG. 3 below.

At block 118, data model 120 can be generated using design graph 110 and block and interface library 114. Data model 120 can include the matched and/or inferred interfaces and the matched and/or inferred blocks from operations 112 and 116, respectively. Data model 120 can be compatible with a graphical design environment. In a graphical design environment, a circuit design is displayed to a user as blocks that are connected by lines. The blocks represent circuit modules and the lines represent signals communicated between the modules. The graphical design environment allows the user to configure parameters of the modules by way of menus or windows, for example, via various Graphical User Interface (GUI) widgets, such as drop down lists (a box that allows selection of one or more possible options) or fill-in-the blank boxes. Additional modules can be instantiated in the circuit design by dragging from a library elements that represent desired modules and dropping the elements in a display area having the circuit design. HDL code may be associated with the graphical elements but is hidden from the user.

Data model 120 has vertices and edges representative of objects from the block and interface library 114. Information from the block and interface library 114 can be used to generate data model 120, such as an interface definition and/or an IP block definition. An interface definition can include, but is not limited to, interface VLNV (a unique identifier of vendor, library, name, and version), parameter specification (e.g., name, value, type, supported range), and logical-to-physical port mapping specification (e.g., logical-to-physical name map, width, default driver value). A block definition can include, but is not limited to, IP VLNV (a unique identifier string), parameter specification (e.g., name, value, type, supported range), list of interfaces (interface VLNV, interface name, logical-to-physical name map, parameter specification, pin width), and list of pins (name, width, parameter specification).

Design graph 110 can be rendered in-place to generate data model 120. After design graph 110 is rendered, a flat translation of design graph 110 can be performed such that data model 120 is compatible with a graphical design environment. The properties discussed above associated with blocks, pins, and/or interfaces can be used for the translation. The source and/or destination of an edge as well as a user-specified tag associated with an edge, such as the HDL-attribute "don't touch" or "mark-debug," can be used in generating data model 120. Data model 120 can provide getter application programming interfaces (APIs) to traverse and query properties of the blocks and edges.

In an exemplary implementation, an intermediate design graph (not shown), including the matched interfaces and blocks, can be equivalent to data model 120 and, in some cases, the intermediate design graph can be used with the graphical design environment in place of data model 120. However, data model 120 can be used for inferring additional information, such as addressing specification or metadata. The additional information can be referred to as "decorations" of data model 120. Examples of decorations can include properties associated with inferred objects (e.g., blocks, pins, interfaces, nets, interface-connections) of data model 120 to make data model 120 compatible with a graphical design environment.

At block 126, data model 120 can be translated into block diagram data model 128. Block diagram data model 128 can provide constructor, getter, and setter APIs to construct, query, and set object in block diagram data model 128. Translating design graph 120 can include using the getter APIs to translate (map) an object of data model 120 to an object of block diagram data model 128. The constructor and setter APIs can be used to construct, query, and set object in block diagram data model 128. Translating design graph 118 can include inferring metadata from data model 120 and adding the metadata to block diagram data model 128.

Data model 120 can have a one-to-one mapping with block diagram data model 128 ("bare metal" data model). A "bare metal" data model is a tool-independent, generic intermediate data model suitable for conversion to any graphical design environment. The "bare metal" data model will only have the blocks, external pins and/or interfaces, and nets and/or interface connections and the user-specified properties (tags) on the modules, pins and/or interfaces. To be used in a specific graphical design environment, the "bare metal" data model can be "decorated" with additional metadata. The metadata can include, but are not limited to, address assignment-specific details (address space/address blocks associated with interface objects), connectivity-specific or clock-reset-specific metadata (e.g., clock domain, reset signal, bus interface, asynchronous reset signal, and debug enable flag), and metadata for graphical representation (e.g., location, color, enablement/disablement in GUI). The "bare metal" data model can be "decorated" with additional properties and/or attributes during translating data model 120 at block 126 to make block diagram data model 128 compatible with features of the specific graphical design environment (e.g., automatic connectivity, automatic logic inference via software designer assistance, address assignment within a graphical tool).

Translating HDL specification 104 to block diagram data model 128 in accordance with the present disclosure can significantly reduce, if not fully eliminate, the amount of HDL code that has to be written manually. A virtual software assistant can be used to update the circuit design described by HDL specification 104 in a graphical design environment. After HDL specification 104 is translated to block diagram data model 128, the circuit design can be modified and/or updated in a graphical design environment.

At block 130, configuration data is generated from the block diagram data model 128 for implementing a circuit from the circuit design. For example, place-and-route and bitstream generation tools may be executed to generate configuration data for an FPGA or generate fabrication data for manufacturing an application-specific integrated circuit (ASIC). At block 132, a circuit can be manufactured from the configuration data generated at block 130. For example, an application-specific integrated circuit (ASIC) can be fabricated or a programmable integrated circuit (IC) may be configured with the configuration data.

Figure 2:
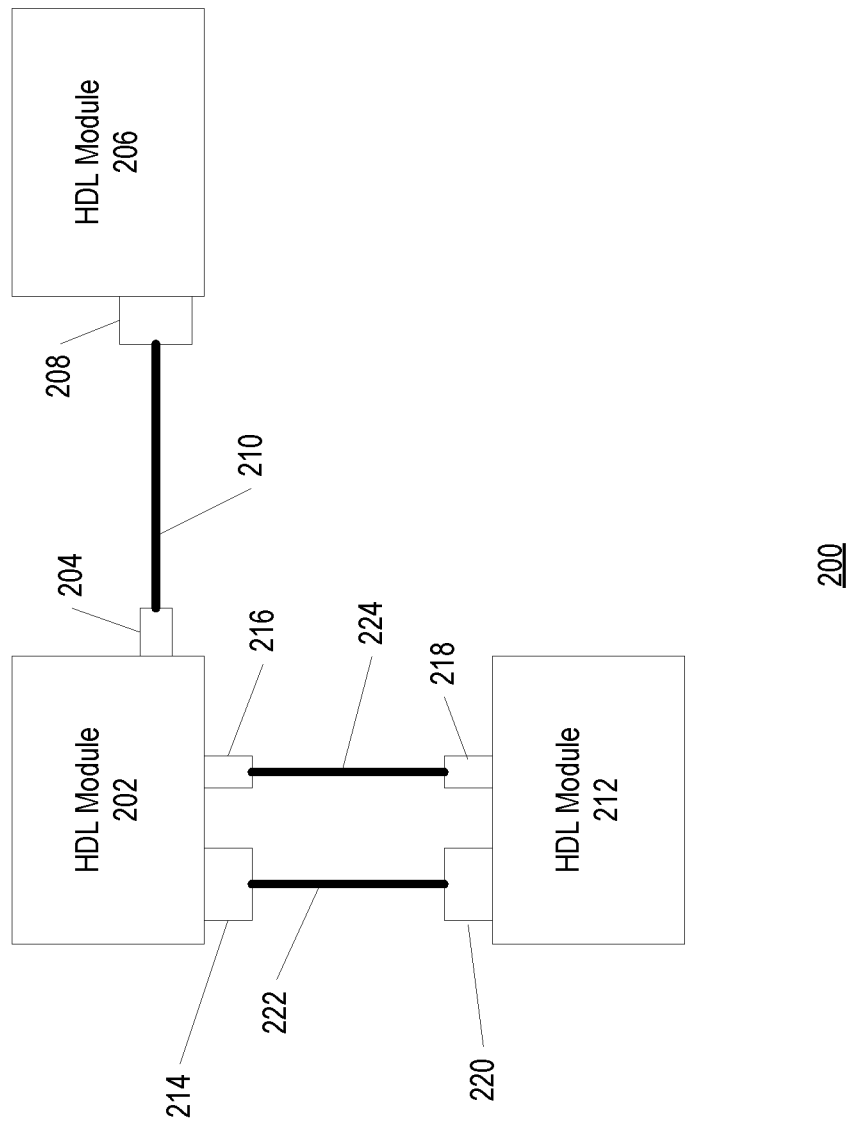
FIG. 2 shows an exemplary design graph of a hardware description language (HDL) specification of a circuit design.

FIG. 2 shows an exemplary design graph 200 of an HDL specification of a circuit design. Design graph 200 can be analogous to design graph 110 illustrated in FIG. 1. Design graph 200 includes three vertices that are representative of HDL modules 202, 206, and 212, and three edges 210, 222, and 224. An edge of design graph 200 can, for example, correspond to a connection between two HDL modules, an HDL module and a top-level port, or an HDL module and a top-level interface or port. An edge can be defined by a source and a destination. A source and/or a destination can be a top-level pin or interface, or a pin or interface of an HDL module. As illustrated in FIG. 2, edge 222 connects interface 214 of HDL module 202 to interface 220 of HDL module 212, edge 224 connects pin 216 of HDL module 202 to pin 218 of HDL module 212, and edge 210 connects pin 204 of HDL module 202 to interface 208 of HDL module 206.

A source and destination can have a name and properties, such as user-specified tags. Names and/or user-specified tags can be used to infer an interface of a block and interface library as described above in association with block 112 illustrated in FIG. 1. The design graph 200 can be a multigraph including more than one edge between two vertices, where each of the edges is a primitive entity. FIG. 2 shows edges 222 and 224 between HDL modules 202 and 212. Tags included in the HDL circuit design can be included as information associated with the vertices and/or edges in design graph 200.

Figure 3:
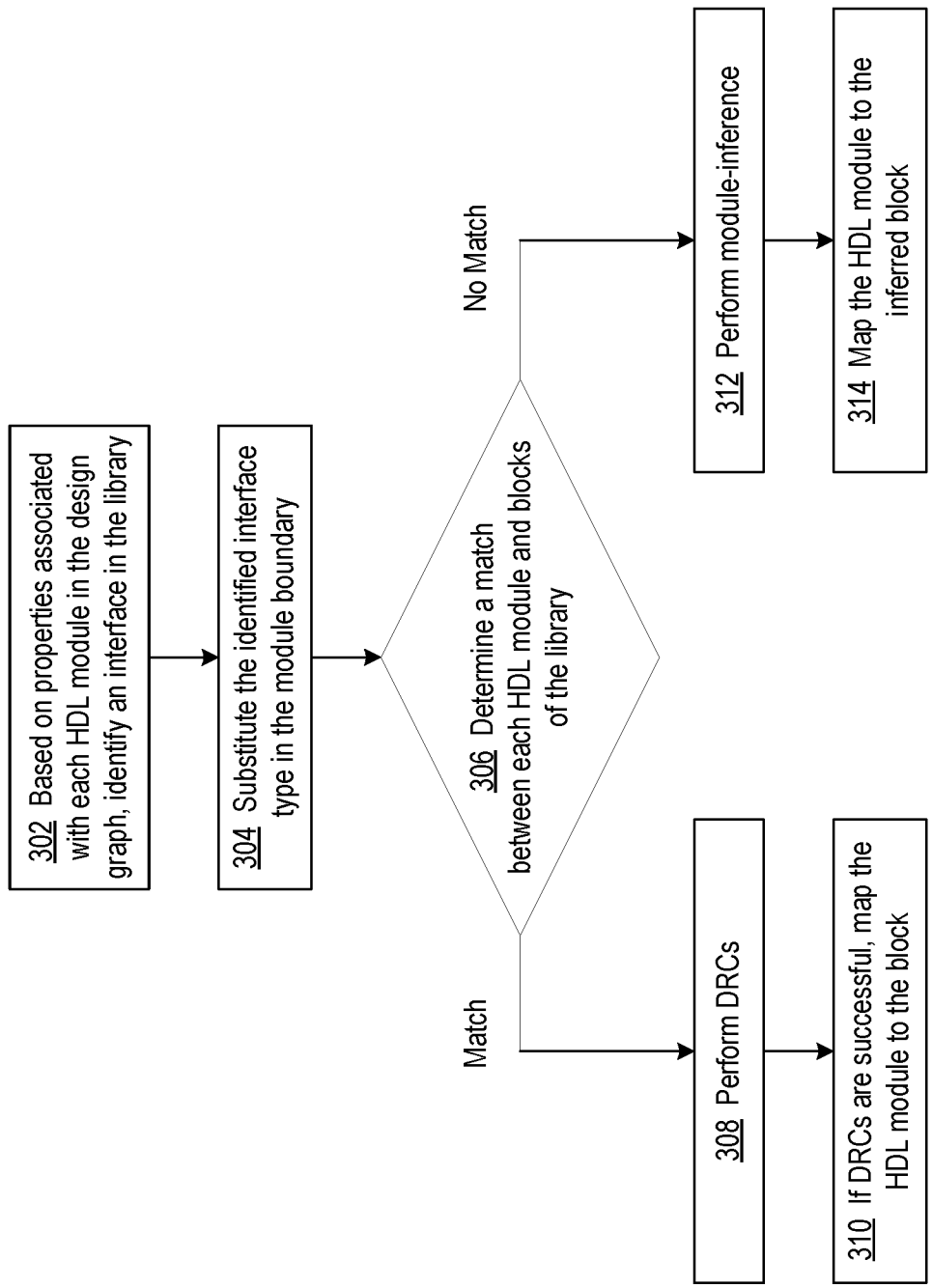
FIG. 3 shows a flowchart of an exemplary process for determining matches between blocks of the block and interface library and modules of a design graph.

FIG. 3 shows a flowchart of an exemplary process for determining matches between blocks of the block and interface library and modules of a design graph. At block 302, for each vertex (e.g., HDL module 102) in a design graph (e.g., design graph 110), based on the properties associated with each HDL module (e.g., tags), an interface type of a library (e.g., block and interface library 114) can be identified. At block 304, the identified interface type can be substituted in a module boundary to generate an intermediate representation of the HDL module. The module boundary is the part of the module through which the signals are communicated with another module(s).

At block 306, a match between each HDL module of the design graph and block types of the library can be determined. For example, a tag of an HDL module can be matched to VLNVs of blocks in the library. If a match is determined, then at block 308 design rule checks (DRCs) can be performed to match against parameter and/or generic specifications and/or interface and/or pin descriptions of the block from the library. At block 310, if the DRCs are successful then the HDL module can be mapped to the block (e.g., block 402 illustrated in FIG. 4) from the library.

If an absence of a match is determined, then at block 312 a module-inference can be performed. The module-inference can package the definition of the HDL module as an IP block and add the inferred IP block to the library. At block 314, the HDL module can be mapped to the inferred IP block.

Figure 4:
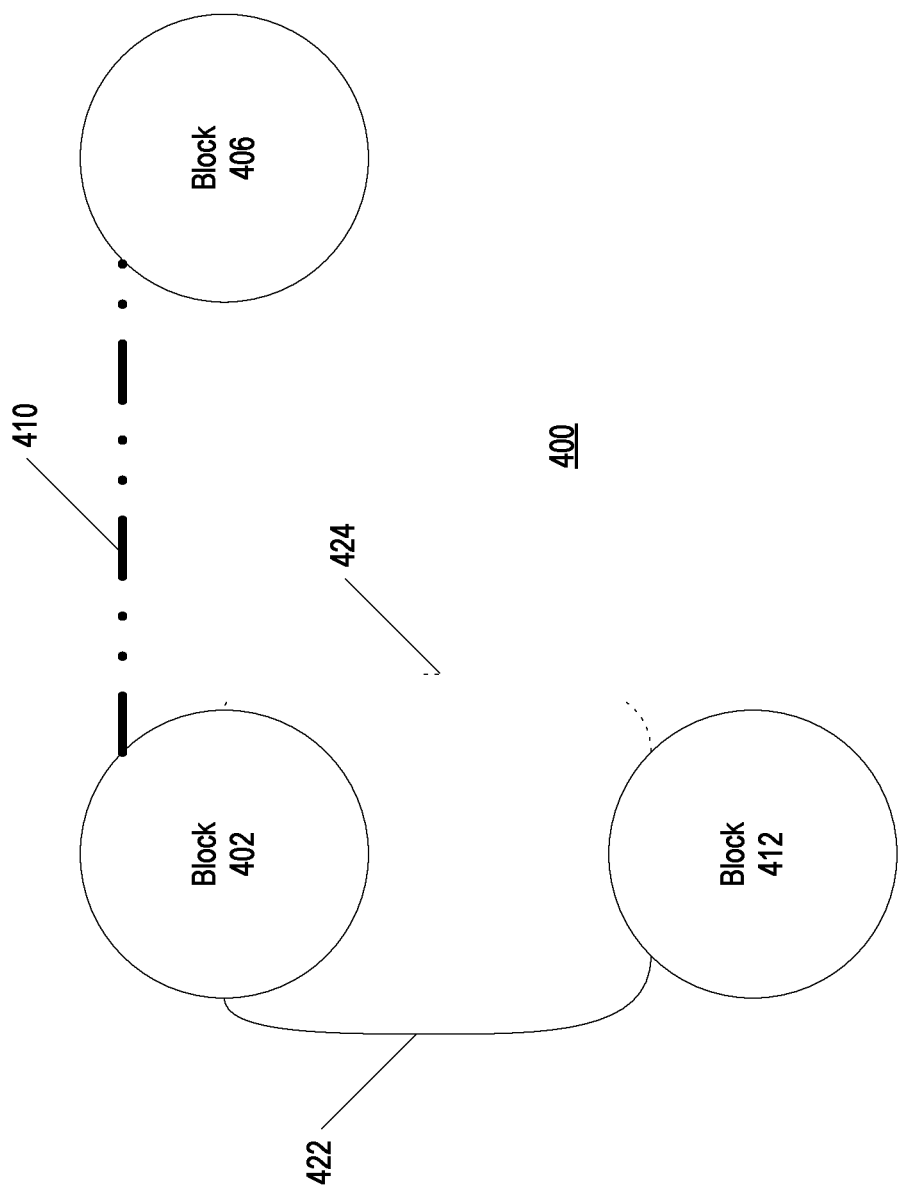
FIG. 4 shows an exemplary design graph including matched blocks and connections.

FIG. 4 shows an exemplary design graph 400 including matched blocks and connections. Design graph 400 can be analogous to data model 120 illustrated in FIG. 1. In the example of FIG. 4, block 402 corresponds to a block from the library (e.g., the block and interface library 114) that maps to HDL module 202 illustrated in FIG. 2, block 406 corresponds to a block from the library that maps to HDL module 206, and block 412 corresponds to a block from the library that maps to HDL module 212. In at least one embodiment, at least one of the blocks 402, 406, and 412 can be an inferred IP block as opposed to a block from the library. Interface 410 is from the library and maps to edge 210.

Edges of design graph 110 can be converted to equivalent connection objects, such as "nets" connecting two or more pins or "interface-connections" connecting two or more interfaces in the data model 120. Because edge 222 connected two pins, in design graph 400 edge 222 is replaced with "net" 422. Because edge 224 connected two interfaces, in design graph 400 edge 224 is replaced with "interface-connection" 424.

As discussed above, design graph 400 can be analogous to the data model 120 illustrated in FIG. 1. The data model can include blocks and connections. Properties associated with blocks can include, but are not limited to, name, mapped IP, parameter specification (e.g., name, type, value), pins (name, type, parameters), interface (name, type, logical-to-physical mapping, parameters), and user-specified attributes (e.g., comments). Connections can be between module-pins and interfaces or between top-level pin/interfaces and module pin/interface. Properties associated with connections can include, but are not limited to, tags such as "don't_touch" or "mark_debug."

The data model can describe the blocks and the connections between them, but the data model may not describe address assignment details (e.g., address-space or address-blocks associated with interface objects), connectivity metadata and/or clock-reset metadata (e.g., CLK_DOMAIN, ASSOCIATED_RESET, ASSOCIATED_BUSIF, ASSOCIATED_ASYNC_RESET, CAN_DEBUG), and metadata for a graphical design environment (e.g., location, color, enablement and/or disablement in a GUI). These properties can be associated with objects of a block diagram data model (e.g., block diagram data model 128) during translation of the data model as described above in association with block 126 of FIG. 1. The block diagram data model can be used to make the data model compatible with features of a graphical design environment, such as automatic connectivity, automatic logic interface, and address assignment within the graphical design environment.

Figure 5:
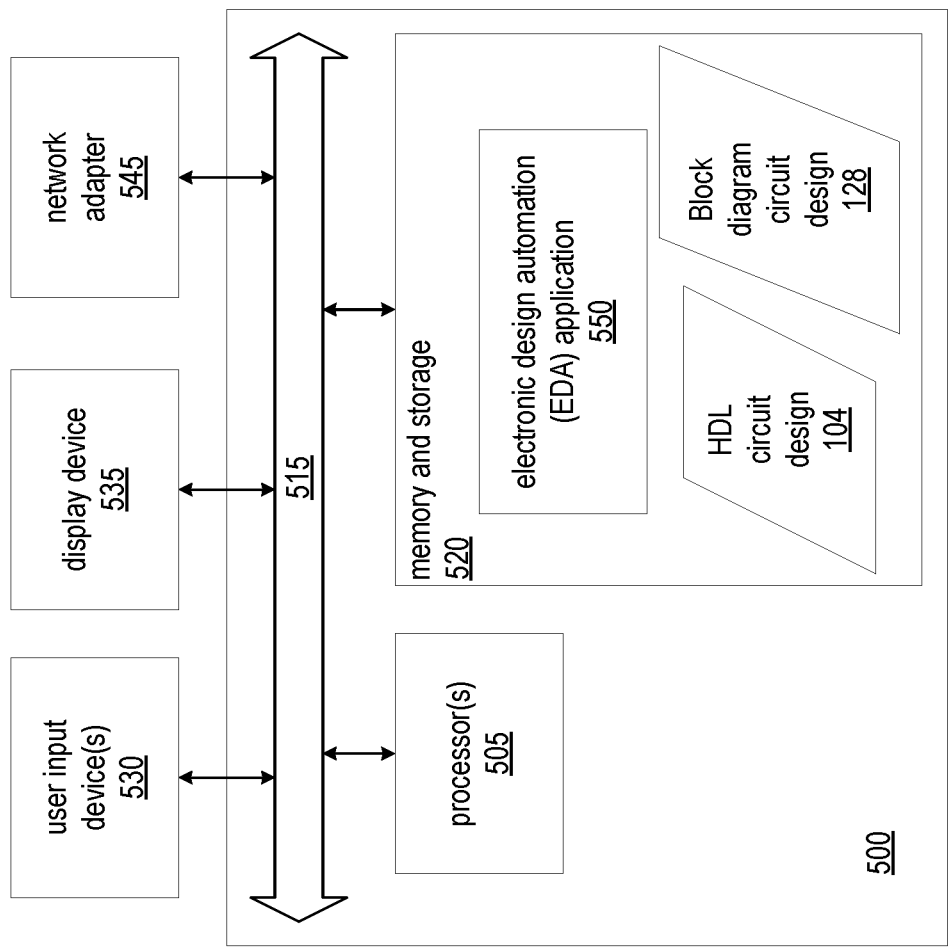
FIG. 5 is a block diagram illustrating an exemplary data processing system.

FIG. 5 is a block diagram illustrating an exemplary data processing system (system) 500 that can be specifically programmed to implement the disclosed processes. System 500 is an example of an Electronic Design Automation (EDA) system. As pictured, system 500 includes at least one processor circuit (or "processor") 505, e.g., a central processing unit (CPU), coupled to memory and storage arrangement 520 through a system bus 515 or other suitable circuitry. System 500 stores program code and HDL specification 104 within memory and storage arrangement 520. Processor 505 executes the program code accessed from the memory and storage arrangement 520 via system bus 515. In one aspect, system 500 is implemented as a computer or other data processing system that is suitable for storing and/or executing program code. It should be appreciated, however, that system 500 can be implemented in the form of any system including a processor and memory that is capable of performing the functions described within this disclosure.

Memory and storage arrangement 520 includes one or more physical memory devices such as, for example, a local memory (not shown) and a persistent storage device (not shown). Local memory refers to random access memory or other non-persistent memory device(s) generally used during actual execution of the program code. Persistent storage can be implemented as a hard disk drive (HDD), a solid state drive (SSD), or other persistent data storage device. System 500 may also include one or more cache memories (not shown) that provide temporary storage of at least some program code and data in order to reduce the number of times program code and data must be retrieved from local memory and persistent storage during execution.

Input/output (I/O) devices such as user input device(s) 530 and a display device 535 may be optionally coupled to system 500. The I/O devices may be coupled to system 500 either directly or through intervening I/O controllers. A network adapter 545 also can be coupled to system 500 in order to couple system 500 to other systems, computer systems, remote printers, and/or remote storage devices through intervening private or public networks. Modems, cable modems, Ethernet cards, and wireless transceivers are examples of different types of network adapter 545 that can be used with system 500.

Memory and storage arrangement 520 may store an EDA application 550. EDA application 550, being implemented in the form of executable program code, is executed by processor(s) 505. As such, EDA application 550 is considered part of system 500. System 500, while executing EDA application 550, receives and operates on HDL specification 104. In one aspect, system 500 performs a design flow on HDL specification 104, and the design flow may include synthesis, mapping, placement, routing, and the translation of an HDL circuit design into a block diagram circuit design having a format suitable for a graphical design environment as described herein.

EDA application 550, HDL specification 104, block diagram data model 128, and any data items used, generated, and/or operated upon by EDA application 550 are functional data structures that impart functionality when employed as part of system 500 or when such elements, including derivations and/or modifications thereof, are loaded into an IC such as a programmable IC causing implementation and/or configuration of a circuit design within the programmable IC.

Though aspects and features may in some cases be described in individual figures, it will be appreciated that features from one figure can be combined with features of another figure even though the combination is not explicitly shown or explicitly described as a combination.

The disclosed methods and system are thought to be applicable to a variety of systems for preparing and/or maintain circuit designs. Other aspects and features will be apparent to those skilled in the art from consideration of the specification. It is intended that the specification and drawings be considered as examples only, with a true scope of the invention being indicated by the following claims.

What is claimed is:

1. A method, comprising:
   inputting a hardware description language (HDL) specification of a circuit design to a programmed processor;
   generating by the programmed processor a design graph of the circuit design from the HDL specification;
   determining matches between interfaces and modules of the HDL specification and interfaces and blocks in a library of graphical design objects by the programmed processor; and
   translating by the programmed processor, the design graph into a data model that describes matching blocks, interfaces from the library, and connections between the blocks based on the matches determined between modules of the HDL specification and blocks of the library, wherein the data model is compatible with a graphical design environment and has data that specify graphical blocks that correspond to the modules of the HDL specification and data that specify graphical lines that correspond to signal communications between the modules, and the graphical blocks and graphical lines are user configurable.

2. The method of claim 1, wherein the determining matches includes determining matches between meta-data associated with the modules in the design graph and metadata associated with blocks in the library.

3. The method of claim 2, wherein the determining includes determining matches between metadata associated with pins of the design graph and metadata associated with interfaces in the library.

4. The method of claim 3, wherein the determining includes determining matches between a first prefix of names of pins of the design graph and a second prefix of names of interfaces in the library.

5. The method of claim 1, wherein the determining includes:
   identifying an interface type in the library for each module of the design graph;
   substituting the identified interface type in a boundary of each module;
   determining a match between a tag associated with each module to a unique identifier of a block type in the library;
   in response to determining a match between the tag and the unique identifier, performing a design rule check; and
   in response to determining absence of a match between the tag and the unique identifier, performing a module-inference.

6. The method of claim 5, wherein performing the module-inference includes adding a block to the library having a definition of the module.

7. The method of claim 1, further comprising performing a syntax and semantics check on the design graph prior to the determining.

8. The method of claim 1, further comprising generating an intermediate design graph of the circuit design based on connections specified in the design graph and blocks of the library determined to match the modules of the HDL specification.

9. The method of claim 1, wherein the translating includes:
   traversing and querying properties of blocks of the design graph; and
   constructing, querying, and setting objects in the data model.

10. The method of claim 1, further comprising:
    generating from the data model, configuration data for implementing the circuit design; and
    configuring a programmable IC with the configuration data to implement the circuit design on the programmable IC.

11. A system, comprising:
    a processor; and
    a memory and storage arrangement coupled to the processor, wherein the memory and storage arrangement is configured with instructions that when executed by the processor cause the processor to perform operations including:
      inputting an hardware description language (HDL) specification of a circuit design;
      generating a design graph of the circuit design from the HDL specification;
      determining matches between interfaces and modules of the HDL specification and interfaces and blocks in a library; and
      translating the design graph into a data model that describes matching blocks, interfaces from the library, and connections between the blocks based on the matches determined between modules of the HDL specification and blocks of the library, wherein the data model is compatible with a graphical design environment and has data that specify graphical blocks that correspond to the modules of the circuit design and lines that correspond to signal communications between the modules, and the graphical blocks and graphical lines are user configurable.

12. The system of claim 11, wherein the memory and storage arrangement is further configured with instructions that when executed by the processor cause the processor to determine the matches by:
    determining matches between metadata associated with the modules in the design graph and metadata associated with blocks in the library.

13. The system of claim 12, wherein the memory and storage arrangement is further configured with instructions that when executed by the processor cause the processor to determine the matches by:
    determining matches between metadata associated with pins of the design graph and metadata associated with interfaces in the library.

14. The system of claim 13, wherein the memory and storage arrangement is further configured with instructions that when executed by the processor cause the processor to determine the matches by:
    determining matches between a first prefix of names of pins of the design graph and a second prefix of names of interfaces in the library.

15. The system of claim 11, wherein the memory and storage arrangement is further configured with instructions that when executed by the processor cause the processor to determine the matches by:
    identifying an interface type in the library for each module of the design graph;
    substituting the identified interface type in a boundary of each module;
    determining a match between a tag associated with each module to a unique identifier of a block type in the library;
    in response to determining a match between the tag and the unique identifier, performing a design rule check; and
    in response to determining absence of a match between the tag and the unique identifier, performing a module-inference.

16. The system of claim 15, wherein the memory and storage arrangement is further configured with instructions that when executed by the processor cause the processor to perform the module-inference by:
    adding a block to the library having a definition of the module.

17. The system of claim 11, wherein the memory and storage arrangement is further configured with instructions that when executed by the processor cause the processor to:
    perform a syntax and semantics check on the design graph prior to the determining.

18. The system of claim 11, wherein the memory and storage arrangement is further configured with instructions that when executed by the processor cause the processor to:

generate an intermediate design graph of the circuit design based on connections specified in the design graph and blocks of the library determined to match the modules of the HDL specification.

19. The system of claim 11, wherein the memory and storage arrangement is further configured with instructions that when executed by the processor cause the processor to translate the design graph by:
  traversing and querying properties of blocks of the design graph; and
  constructing, querying, and setting objects in the data model.

20. The system of claim 11, wherein the memory and storage arrangement is further configured with instructions that when executed by the processor cause the processor to:
  generate from the data model, configuration data for implementing the circuit design; and
  configure a programmable IC with the configuration data to implement the circuit design on the programmable IC.

* * * * *